(12) United States Patent
Reesor

(10) Patent No.: US 7,461,113 B2
(45) Date of Patent: Dec. 2, 2008

(54) REDUCED COMPLEXITY ADAPTIVE FILTER

(75) Inventor: Gord Reesor, Ontario (CA)

(73) Assignee: Zarlink Semiconductor Inc., Kanata (CA)

( * ) Notice: Subject to any disclaimer, the term of this patent is extended or adjusted under 35 U.S.C. 154(b) by 768 days.

(21) Appl. No.: 10/867,140

(22) Filed: Jun. 14, 2004

(65) Prior Publication Data

US 2005/0027768 A1 Feb. 3, 2005

(30) Foreign Application Priority Data

Jun. 28, 2003 (GB) ................. 0315169.3

(51) Int. Cl.
*G06F 17/10* (2006.01)
*H03H 7/30* (2006.01)

(52) U.S. Cl. .................. 708/319; 708/322; 375/232

(58) Field of Classification Search ................. 708/319, 708/322, 323; 375/232
See application file for complete search history.

(56) References Cited

U.S. PATENT DOCUMENTS

| 5,526,377 A | 6/1996 | Yedid et al. |
| 5,566,101 A | 10/1996 | Kodra |
| 6,269,117 B1 | 7/2001 | Peng |
| 6,275,835 B1 | 8/2001 | Pisek et al. |
| 2004/0037354 A1 * | 2/2004 | Jayaraman et al. .......... 375/229 |

FOREIGN PATENT DOCUMENTS

| EP | 0094762 | 11/1983 |
| EP | 0156648 A2 | 10/1985 |
| EP | 1298799 A1 | 4/2003 |
| JP | 060181424 A | 6/1994 |
| WO | WO 99/007071 A1 | 2/1999 |
| WO | WO 03/107557 | 12/2003 |

* cited by examiner

*Primary Examiner*—Chuong D Ngo
(74) *Attorney, Agent, or Firm*—Lawrence E. Laubscher, Jr.

(57) ABSTRACT

A FIR filter for use in an adaptive multi-channel filtering system, includes a first memory for storing data, and a second memory for storing filter coefficients. The second memory stores only non-zero valued coefficients or coefficients that are above a predetermined magnitude threshold such that the overall number of coefficients processed is significantly reduced.

17 Claims, 2 Drawing Sheets

REDUCED COMPLEXITY ADAPTIVE FILTER

FIELD OF THE INVENTION

The invention relates generally to the adaptive filters, and more particularly to adaptive filters for applications such as echo cancellation, noise reduction, or any other adaptive filtering system in which a relatively large FIR filter is used in the implementation.

BACKGROUND OF THE INVENTION

A FIR (Finite Impulse Response) filter is one element of an adaptive filter. It is generally implemented with a DSP (Digital Signal Processor) using memory, and the inner product between a set of stored coefficients and stored previous history of an input signal. Reduced power consumption and storage requirements are desirable in multi-channel applications such as echo cancellation, as the dominant cost and power dissipation is due to memories embedded on chip. There is a need to reduce the amount of memory storage required for echo cancellation and other applications that use FIR filters.

Prior art implementations typically use one storage location for every coefficient in the FIR filter. An example is shown in FIG. 1. In this example, filter coefficients are stored in Coef-RAM 10, which typically consists of 128 Kbytes (2 Kbytes @128 ms/channel). Associated data are stored in Data-RAM 12, and an address counter 14 is used to supply an address to sequentially read out the coefficients one by one from the RAM 10.

The counter address is also split into a 10-bit segment and a 6-bit segment. An offset from modulo counter 15 is added to the 10-bit address segment so as to implement a circular buffer memory for each channel in the Data-RAM 12. The 6 bit address segment is used to select the current circular buffer for each channel that is implemented, as well as to select the appropriate accumulator 21 for each filter output.

Expanded G.711 data from block 17 is convolved in convolution block 20 with coefficients to form the accumulated filter outputs.

Some prior art implementations attempt to reduce the number of stored coefficients by eliminating the zero valued coefficients in order to reduce the required amount of memory storage. Unfortunately with these prior art implementations it sometimes happens that more coefficients are required to model the system than can be handled by the resources available to each particular channel.

SUMMARY OF THE INVENTION

The invention provides a more efficient way of implementing multi-channel voice echo cancellation for telecom networks. Memory usage is optimized, while performance on rare but more demanding channels is not compromised.

According to the present invention there is provided a FIR filter for use in an adaptive multi-channel filtering system, comprising a first memory for storing data; and a second memory for storing filter coefficients, said second memory storing only non-zero valued coefficients or coefficients that are above a predetermined magnitude threshold such that the overall number of coefficients processed is significantly reduced.

The FIR filter in accordance with the invention when used in a multi-channel network echo cancellation unit can result in a substantial reduction in the amount of storage memory for filter coefficients without compromising the ability to model more demanding echo paths (which are statistically rare).

In a preferred embodiment, coefficients are stored along with the memory address of the corresponding data to be associated with each coefficient.

Embodiments of the invention allow a variable number of coefficients to be used for each channel and the coefficients may be stored without regard for order of the coefficients.

The separate accumulator registers or memory locations, one for each channel, with corresponding address field stored along with coefficients permit the appropriate accumulator to be selected for each convolved product (coefficient*data).

The adaptive filter can be constructed with commercial DSP devices and software, or inside an ASIC or FPGA device. The invention relates to a more efficient implementation of a FIR filter for certain applications that allow the simplification. The invention is particularly suitable to one application in particular (network echo cancellation) for voice telephony networks, although it could apply to other applications with similar circumstances in which not all the filter coefficients are required at all times.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

The principle of processing only non-zero taps with a FIR filter will first be reviewed. It is well known that in telecom (voice telephony) networks, the required echo tail capacity is a maximum of about 128 ms, although it is possible to find cases larger that this. The term "echo tail" refers to the impulse response of the echo path. Typically, this echo tail consists of large network delays represented by zero valued samples of the impulse response, and one or more short echo transfer functions caused by hybrid circuits in the network. The typical length of a hybrid echo response is usually about 5 ms. If an echo canceller provides an echo tail capacity of 128 ms, then usually, most of the filter coefficients that model the echo will ideally be zero valued. Some channels will need much more than 5 ms of non-zero valued coefficients, and these instances are statistically rare, yet still important to handle adequately. When a single DSP or ASIC device must implement hundreds of voice channels, the overall number of non-zero valued filter coefficients for all channels is significantly less than the maximum possible number.

Figure 1:
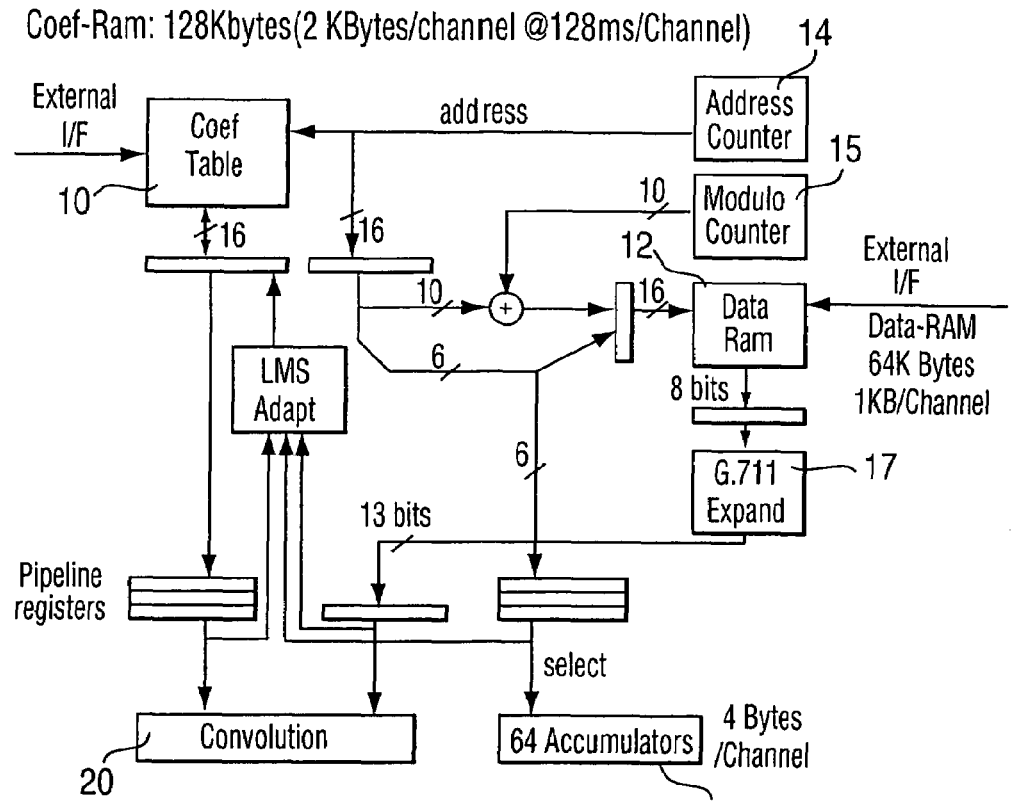
FIG. 1 shows a prior art implementation of a multi-channel FIR filter using one storage location for every coefficient.
Figure 2:
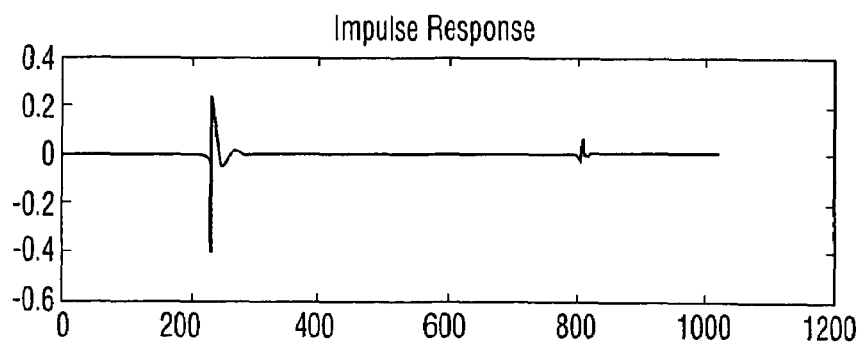
FIG. 2 shows examples of impulse response for a typical channel with the corresponding active tap values identified.
Figure 2:
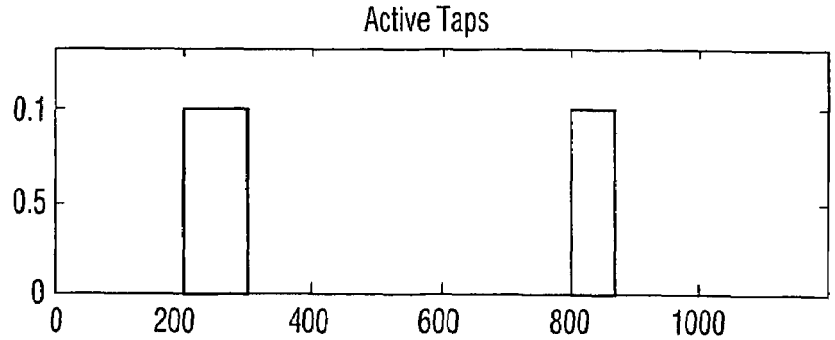

FIG. 2 shows a two reflector echo path (which is rare), with a total of 150 active tap (coefficient) values identified, out a total of 1024 coefficients. If the implementation limits the maximum number of coefficient values for a given channel to 205 (20%) for example, then there might be a case where this is not enough coefficients to model a channel that has a longer echo tail.

In according with the principles of the invention, only the active coefficients, along with the "address" that each active coefficient corresponds to, are stored. The address points to the location in the FIR filter where the corresponding data value in located. Although it takes more memory to store both the coefficient and address, it is far more memory efficient overall, than if all coefficients are stored, including zero valued coefficients. This is not a "windowed FIR" approach which relies upon identifying a few windowed regions; rather it is an approach that identifies all the non-zero coefficients.

Figure 3:
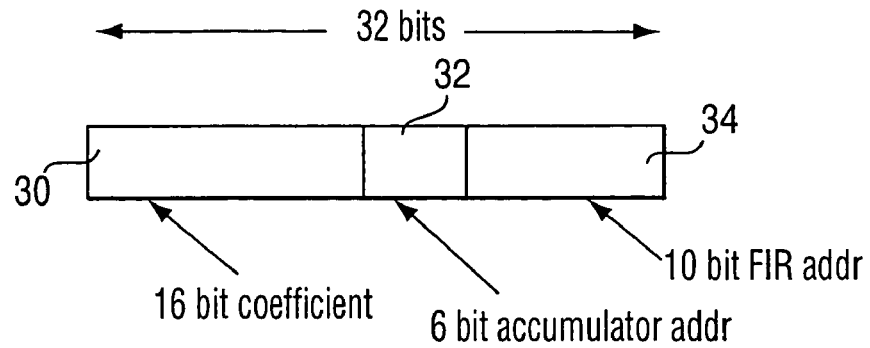
FIG. 3 shows the contents of 32 bit storage locations in one embodiment of the invention.

FIG. 3 shows the contents of 32 bit storage locations in accordance with an embodiment of the invention. Each memory location includes the coefficient field 30 as well as two address fields 32, 34. The first such address field 32 is a 6-bit accumulator address, which is used to identify which channel the coefficient belongs to. The second address field 34 provides a 10 bit address referring to the location of the coefficient within the FIR filter for that particular channel.

Together, both address fields provide an absolute memory address in the PCM data memory (a second memory used for prior input signal history) for up to 64 channels. The width of the address fields used above are for the preferred embodiment, and may be varied as appropriate for any variation of the implementation or for other applications.

Figure 4:
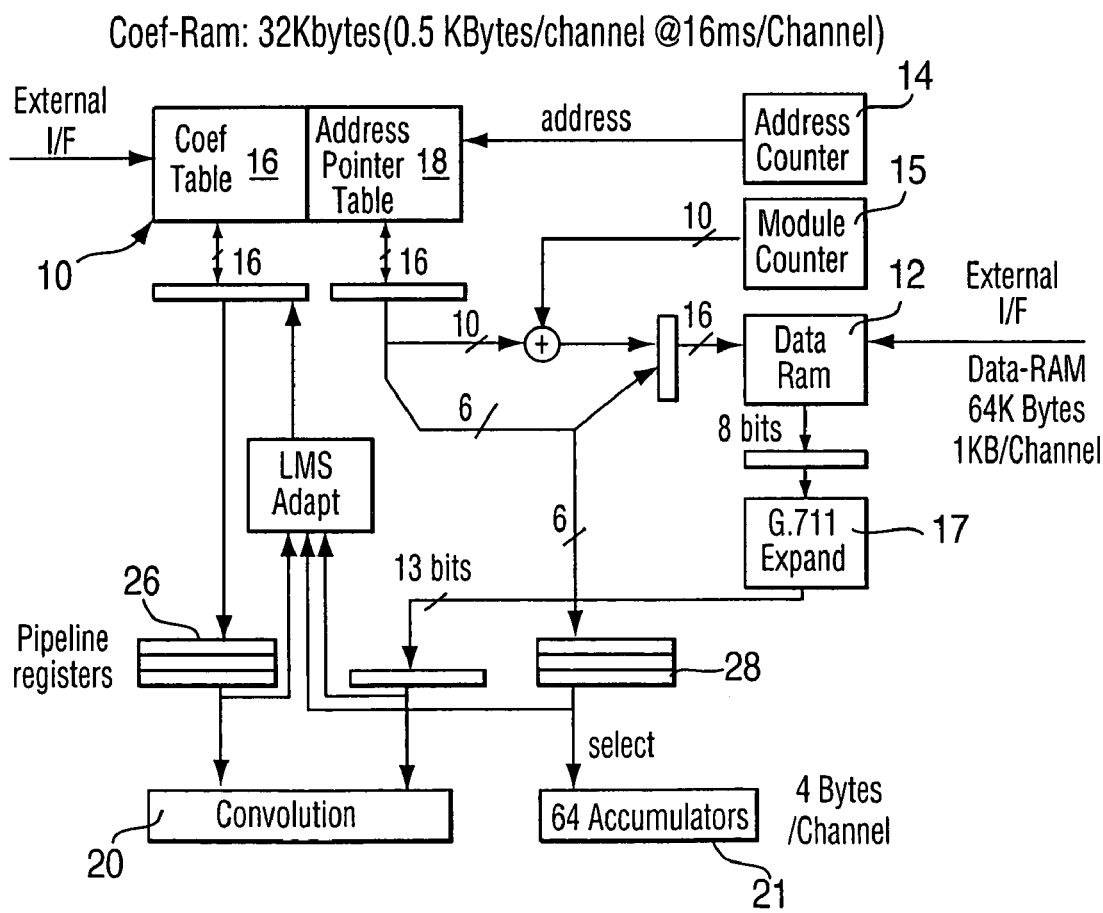
FIG. 4 is a block diagram of a preferred embodiment of the invention.

FIG. 4 shows a preferred embodiment of the invention. Each location of the Coefficient-RAM consists of a 16 bit filter coefficient 16, and a 16 bit address pointer 18. The 16-bit address pointer 18 is used to locate the corresponding data within the PCM data ram 12, which consists of circular 128 ms buffers, one for each channel. The address consists of a 6 bit channel number and a 10 bit coefficient location. The channel number is used to select which Data-RAM buffer and which Accumulator to use.

The circular buffers are maintained by incrementing a modulo offset counter 15 once per frame. A benefit of this arrangement is that individual channels can be allocated to the size needed without any extra memory management complexity. Coefficients for any given channel can be placed anywhere in the Coef-RAM memory or distributed into different sections of the memory if necessary, i.e. each individual coefficient is independent of the order of the others, and may be placed anywhere. This provides for allocation and re-allocation of channels with different echo tail capacity without the complexity of having to re-arrange the memory when a new channel is allocated with a larger or smaller number of coefficients used.

The filter coefficients 16 are output into temporary register 25 from where they pass through pipeline registers 26 to convolution unit 20. The address pointers 18 are output into temporary register 26 from where the 6-bit segments are passed through pipeline registers 28 to accumulators 21 and to data RAM 12 for selecting the appropriate circular buffer. The 10-bit segments are passed to adder 27 where they are added to the offset from modulo counter 14.

Although the Coefficient Ram 10 is considerably smaller than a multi-channel design with full FIR filters would require, the number of coefficients available is still overallocated by more than 300% on average, assuming the average echo dispersion time is only 5 ms. It is possible with this method to allocate for an echo tail with dispersion up to 128 ms.

This invention therefore is efficient in that it uses only the memory that is required for echo paths with short dispersion, yet it is capable of handling echo paths with long dispersion. This method reduces computation and storage for un-needed echo tail capacity dynamically on a per channel basis, and takes into account flat delays as well. There are a total of 8192 coefficients in this example, for 64 channels.

The computation of each FIR output requires one multiplication of each coefficient in the Coef-RAM 10. It is possible to terminate the computation in less than 8192 cycles, since on average it may only be necessary to process about 40 coefficients per channel. In this case the filtering could terminate in a minimum of about 2500 cycles. This could be done by placing a pointer in the Coef-RAM 10 to the last available address of the Data-RAM 12, and providing a circuit to detect when this occurs. The number of clock cycles required to do full FIR filtering on 64 channels @128 ms is 65536 cycles. The number of clock cycles needed for this structure would be between 2500 and 8192, or 4% to 13%. This represents a large reduction of computation and power dissipation.

Memory storage for brute force (full) type FIR filter implementation is: 1024×36 bits=4.5 kB/channel (for 128 ms/channel). For this proposed structure the storage per channel is: 1.5 kB/channel. So this architecture is about 3 times as efficient as the full FIR architecture.

An additional benefit of this structure is that there is no need for order within the coefficient/address memory. Entries in this memory can be in any location in any order. Channels that are disabled (turned off) which no longer need to be processed, could have their respective locations removed. A background process could easily be implemented to compact the usage of the memory so that unused "holes" do not accumulate, and so that new filter coefficients can be loaded after the highest address which is currently active.

Another added benefit is that if an LMS (Least Mean Squares) type coefficient adaptation is to be done on the coefficients, the updated coefficient does not have to be written back to memory in the same location that it was read from (as long as the same address tag is appended). This makes the memory controller simple, while accommodating a pipelined design.

A 6-stage pipeline is shown in the preferred embodiment, including two stages within the convolution block (not shown). The benefit of this is that a high clock speed could be used. If for example it is designed to do 64 channels, and each channel uses an average of 5 ms of echo tail: the required clock is: 2560 cycles/125 usec=20.48 Mhz. So obviously a much higher clock speed can be accommodated and more channels processed, then shown in the preferred embodiment.

The adaptation algorithm for the coefficients can preferably be run off-line, and could be loaded along with the corresponding addresses required, into the Coef-RAM at the appropriate times (determined by external means). Both foreground and background filters can be implemented in the same structure. Foreground filters are ones that are currently canceling echo on active channels with the best-known set of coefficients. Background filters are ones that are in-obtrusively and rapidly searching for new or better coefficient sets in the background.

The invention claimed is:

1. A FIR filter for use in an adaptive multi-channel filtering system, comprising:
   a first memory for storing data;
   a second memory for storing filter coefficients, said second memory storing only non-zero valued coefficients or coefficients that are above a predetermined magnitude threshold such that the overall number of coefficients processed is significantly reduced,
wherein each storage location of said second memory includes a first address field for storing an address identifying a channel associated with the stored coefficient and a second address field for identifying the location of corresponding data within said first memory for that particular channel; and a processing unit for processing said data and said coefficients to form accumulated filter outputs.

2. A FIR filter as claimed in claim 1, wherein said first memory includes a buffer for each channel, and said first address field is used to select a particular data buffer in said first address field.

3. A FIR filter as claimed in claim 2, wherein buffers are circular buffers.

4. A FIR filter as claimed in claim 2, further including an accumulator for each channel, and wherein said first address field is also used to select the particular accumulator associated with said first field.

5. A FIR filter as claimed in claim 1, further comprising an address register for temporarily storing said first and second address fields output from said first memory, a modulo counter for cycling through addresses, and an adder for adding an address output by said modulo counter to and address stored in said second address field.

6. A FIR filter as claimed in claim 5, wherein said processing unit is a convolution unit, said FIR filter further comprising a coefficient register for temporarily storing coefficients output from said second memory and a plurality of pipeline registers between said coefficient register and said convolution unit.

7. A FIR filter as claimed in claim 6, wherein said convolution unit is connected to said accumulators.

8. A FIR filter as claimed in claim 6, wherein a first portion of said address register storing said first address field is connected through a series of pipeline registers to said accumulators.

9. A network echo cancellation unit comprising a FIR filter as claimed in any one of claims 1 to 8.

10. A method of processing coefficients in a FIR filter in an adaptive multi-channel filter system, comprising storing said coefficients in a coefficient memory along with associated address data identifying a corresponding channel and data address in a data memory, using said address data to select an appropriate channel and data address for the associated coefficient, wherein each storage location in said coefficient memory includes a coefficient field for storing a particular coefficient, a first address field for storing data identifying a channel, and a second address field for storing data identifying the storage location in said data memory of the data corresponding to said particular coefficient, and processing said coefficients and associated data in said data memory to form accumulated filter outputs.

11. A method as claimed in claim 10, wherein a variable number of coefficients is used for each channel.

12. A method as claimed in claim 10, further comprising using said first address field to select a circular buffer in said data memory.

13. A method as claimed in claim 12, further comprising using said first address field to select an accumulator associated with the identified channel.

14. A method as claimed in claim 13, wherein said processing comprises convolving each coefficient with the associated data in said data memory and inputting the convolved coefficient into the associated accumulator.

15. A method as claimed in claim 10, further comprising adding said second address field to an output from a modulo offset counter to select a particular storage location in said data memory and maintain circular buffers in said data memory.

16. A method as claimed in claim 15, wherein said address fields are addressed by an address counter.

17. A method as claimed in claim 10, wherein said coefficients are stored without regard for order of the coefficients.

* * * * *